United States Patent

Ushikubo et al.

[11] Patent Number: 5,300,459
[45] Date of Patent: Apr. 5, 1994

[54] METHOD FOR REDUCING THERMAL STRESS IN AN ENCAPSULATED INTEGRATED CIRCUIT PACKAGE

[75] Inventors: Takao Ushikubo, Kawagoe; Naoyuki Kuroe, Niiza, both of Japan

[73] Assignee: Sanken Electric Co., Ltd., Saitama, Japan

[21] Appl. No.: 971,329

[22] Filed: Nov. 4, 1992

Related U.S. Application Data

[63] Continuation of Ser. No. 633,969, Dec. 26, 1990, abandoned.

[30] Foreign Application Priority Data

Dec. 28, 1989 [JP] Japan .................. 1-338246

[51] Int. Cl.$^5$ .............. H01L 21/56; H01L 21/58; H01L 21/60
[52] U.S. Cl. .................. 437/211; 437/214
[58] Field of Search .......... 437/211, 214, 219; 257/792, 795, 789, 790; 523/443

[56] References Cited

U.S. PATENT DOCUMENTS

| | | | |
|---|---|---|---|
| 3,265,647 | 8/1966 | Schaeffer et al. | 523/443 |
| 3,658,750 | 4/1972 | Tsukui et al. | 523/443 |
| 3,693,252 | 9/1972 | Robertson et al. | 437/211 |
| 4,001,655 | 1/1977 | Voyles et al. | 257/790 |
| 4,271,061 | 6/1981 | Suzuki et al. | 523/443 |
| 4,615,741 | 10/1986 | Kobayashi et al. | 524/493 |
| 4,701,479 | 10/1987 | Shiobara et al. | 523/466 |
| 4,788,583 | 11/1988 | Kawahara et al. | 257/790 |
| 4,923,520 | 5/1990 | Anzai et al. | 106/287.34 |
| 4,970,575 | 11/1990 | Soga et al. | 257/786 |
| 5,068,712 | 11/1991 | Murakami et al. | 357/72 |

FOREIGN PATENT DOCUMENTS

| | | | |
|---|---|---|---|
| 58-10841 | 1/1983 | Japan | . |
| 58-110061 | 6/1983 | Japan | 257/789 |
| 59-186351 | 10/1984 | Japan | 437/211 |
| 61-179544 | 8/1986 | Japan | 437/211 |
| 63-90845 | 4/1988 | Japan | 257/795 |

Primary Examiner—Olik Chaudhuri
Assistant Examiner—David E. Graybill
Attorney, Agent, or Firm—Bachman & LaPointe

[57] ABSTRACT

A method wherein a circuit substrate device is provided having a semiconductor element and a circuit substrate between which a protective resin is placed.

The protective resin has a smaller coefficient of linear expansion than that of the circuit substrate and a greater coefficient of linear expansion than that of the semiconductor element. Therefore, the protective resin may mitigate the influences of thermal stress due to differential in the thermal coefficients of expansion between the semiconductor element and circuit substrate to prevent warpage of the circuit substrate.

9 Claims, 2 Drawing Sheets

METHOD FOR REDUCING THERMAL STRESS IN AN ENCAPSULATED INTEGRATED CIRCUIT PACKAGE

This is a continuation of application Ser. No. 633,969 filed Dec. 26, 1990 now abandoned.

BACKGROUND OF THE INVENTION

The present invention relates to a circuit substrate device having a structure where a semiconductor element is electrically connected via electrode lugs to a conductive pattern formed on the substrate.

Some circuit substrate devices have a structure where semiconductor chips (flip chips) are bonded and electrically connected to the conductive pattern on a circuit substrate. The semiconductor chips have solder bumps which form electrode lugs. In such circuit substrate devices, a failure mode tends to occur in which thermal fatigue is produced due to differential in coefficients of thermal expansion between the flip chip and circuit substrate, thereby causing fractures in the solder bumps. It is known that the thermal fatigue characteristics of the solder bumps may be improved by altering shape of the solder bumps. For example, Japanese Patent Publication No. 62333/1988 discloses a method for mitigating thermal fatigue in solder bumps by forming them into longer columns which, however, require preformed solder bumps of larger area. Accordingly, the above-mentioned method is disadvantageous in that the shape of solder bumps would prevent miniaturization of the device and high-density packaging of flip chips. In addition, it is not easy to form such solder bumps in desired column shapes.

Accordingly, it is an object of the present invention to provide a circuit substrate device that is resistant to thermal fatigue.

Another object of the invention is to provide a circuit substrate device that may be manufactured in a small size with high density packaging of flip chips.

Still another object of the invention is to provide a circuit substrate having its higher reliability and longer life in operation at an elevated temperature.

SUMMARY OF THE INVENTION

The foregoing and other objects and advantages are achieved in one embodiment of the present invention in which a circuit substrate device has a semiconductor element and a circuit substrate wherein a conductive pattern is formed on a main surface of the substrate. Main surfaces of the semiconductor element and circuit substrate are placed in an opposite and spaced relation to each other. The semiconductor element is electrically connected via electrode lugs to the conductive pattern.

A protective resin is filled in an area defined between two main surfaces of the semiconductor and circuit substrate. The protective resin consists essentially of granular silica and polyimide or polyamide resin. The protective resin has a smaller coefficient of linear expansion than that of the circuit substrate and a greater coefficient of linear expansion than that of the semiconductor element. The granular silica has an average grain size from 5 $\mu$m to 25 $\mu$m. The protective resin contains from 85.8 wt % to 96.5 wt % of the granular silica.

In another embodiment of the present invention, a first protective resin is filled in an area defined between two main surfaces of the semiconductor and circuit substrate. The first protective resin consists essentially of granular silica and polyimide or polyamide resin. The first protective resin has a smaller coefficient of linear expansion than that of the circuit substrate and a greater coefficient of linear expansion than that of the semiconductor element. A second protective resin covers the semiconductor element and first protective resin. In addition, a resin encapsulant covers the second protective resin which has a greater coefficient of linear expansion than that of the first protective resin and a smaller coefficient of linear expansion than that of the resin encapsulant. The second protective resin contains granular silica and polyimide or polyamide resin. The first and second protective resins are porous. The second protective resin has a smaller porosity than that of the first protective resin. The average grain size of granular silica contained in the first protective resin is from 5 $\mu$m to 25 $\mu$m and the average grain size of granular silica contained in the second protective resin is larger by 5 $\mu$m or more than that contained in the first protective resin. The first protective resin contains from 85.5 wt % to 96.5 wt % of granular silica of the grain size. The second protective resin contains a smaller amount of granular silica than the first protective resin by 2 wt % or more.

According to the present invention, placed between the semiconductor element and the circuit substrate is the protective resin which contains granular silica and polyimide or polyamide resin. Thus, the coefficient of linear expansion of the protective resin may be adjusted at an intermediate value between those of the semiconductor element and circuit substrate, thereby yielding a relatively high modulus of film elasticity. Consequently, although thermal stress is produced due to differential in coefficients of thermal expansion between the semiconductor element and circuit substrate and also mechanical stress is produced due to warpage of the circuit substrate, the protective resin may effectively mitigate influence of such thermal and mechanical stresses on the electrode lugs. To this end, desirable size and content ranges of granular silica may be selected.

In an another embodiment of the present invention, coefficients of linear expansion increases stepwise from the first and second protective resins to the resin encapsulant, thereby decreasing thermal stresses at interfaces of these resins. Since the second protective resin has a smaller porosity than that of the first protective resin, the latter resin may prevent intrusion of detrimental matters such as moisture.

BRIEF DESCRIPTION OF THE DRAWINGS

A more complete understanding of the present invention may be derived by reference to the detailed description and the claims when considered together with the accompanying drawings wherein like reference numbers designate similar parts.

DETAILED DESCRIPTION OF THE INVENTION

An embodiment of the present invention will be described hereinafter wherein it is applied to a hybrid IC for electric power use having a flip chip bonded on a circuit substrate.

Figure 1:
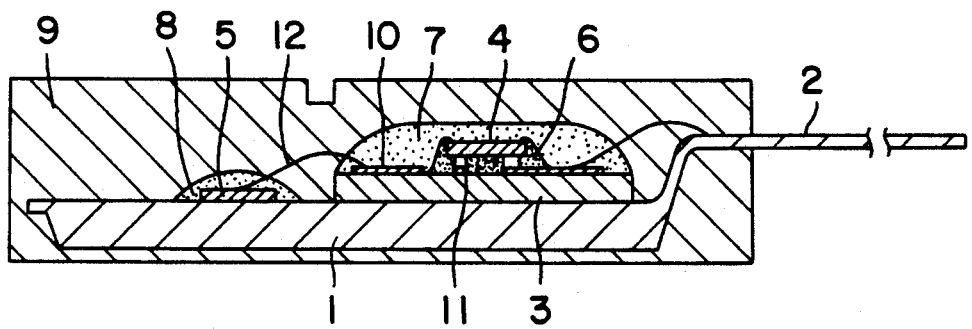
FIG. 1 is a cross-sectional view of a hybrid integrated circuit (IC) for electric power use according to an embodiment of the present invention.
Figure 2:
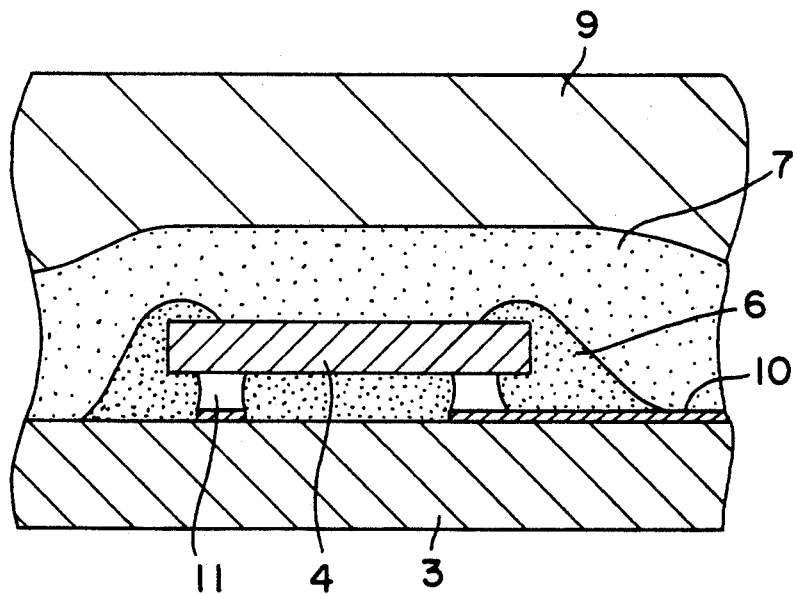
FIG. 2 is an enlarged cross-sectional view of an essential part of FIG. 1.

Referring to FIG. 1, a hybrid IC includes a support pad 1, external leads 2 at least one of which is connected with the support pad 1, a circuit substrate 3 mounted on the support pad 1, a flip chip 4 as a semiconductor element attached on the circuit substrate 3, a semiconductor chip 5 for electric power use, a first protective resin 6 mainly positioned between the circuit substrate 3 and flip chip 4, a second protective resin 7 for covering the flip chip 4 and first protective resin 6 over the circuit substrate 3, a third protective resin 8 for covering the semiconductor chip 5 on the support pad 1 and a resin encapsulant 9 for covering the support pad 1, second and third resins 7, 8 and a part of the external leads 2. The support pad 1 and external leads 2 are formed by punching out a metal sheet so that the support pad 1 has a larger thickness than the external leads 2. The circuit substrate 3 and semiconductor chip 5 are bonded to a main surface of support pad respectively by means of an adhesive and solder. The support pad 1 serves as a heat-radiation plate for the semiconductor chip 5 for electric power use and circuit substrate 3. The circuit substrate 3 comprises an $Al_2O_3$ (alumina) ceramic plate having its coefficient of linear expansion $6.8 \times 10^{-6}/°C$. A conductive pattern 10 is formed on a main surface of the circuit substrate 3 by baking a thick film conductor paste. Electrodes and wiring areas are herein collectively referred to as conductive patterns. The flip chip 4 is a silicon semiconductor chip of monolithic IC which has the coefficient of linear expansion of $3.0 \times 10^{-6}/°C$. Electrodes and solder bumps 11 are formed on a main surface of the flip chip 4. The solder bump 11 consists of a semispherical layer overlying stacked metal layers, the details of which are not shown in FIGS. 1 and 2. In a similar manner to prior arts, the flip chip 4 is placed on the circuit substrate 3 so that the solder bump 11 is bonded by a known solder reflow process to the conductive pattern 10 so that a main surface of flip chip 4 is in opposite and spaced relation to the main surface of circuit substrate 3. The main surface of the flip chip 4 is spaced apart by approximately 100 μm from the main surface of the circuit substrate 3. The first protective resin 6 is filled in an area sandwiched between flip chip 4 and circuit substrate 3.

Unlike the first protective resin 6, the second protective resin 7 is formed over virtually the entire surface of the circuit substrate 3 such that the top surfaces of flip chip 4 and first protective resin 6 are covered by the second protective resin 7. Unlike the first and second protective resins 6 and 7, the third protective resin 8 is formed on the top surface of semiconductor chip 5 such that one end of a lead wire 12 is covered by the third protective resin 8 and the other end of the lead wire 12 is covered by the second protective resin 7. The lead wire 12 provides electrical connection between the semiconductor chip 5 and conductive pattern 10 on the circuit substrate 3. The entire surface of the support pad 1 and the end of external leads 2 are encapsulated by a known transfer molding process with the resin encapsulant 9 which comprises an epoxy resin having its coefficient of linear expansion of $20 \times 10^{-6}/°C$. process. The second and third protective resins 7 and 8 are covered by the resin encapsulant 9.

The first protective resin 6 is filled between the flip chip 4 and circuit substrate 3. The second protective resin 7 covers virtually the entire surface of circuit substrate 3. The most important feature of the embodiment is that the first protective resin 6 has substantially different content from that of conventional protective resins of this type. More specifically, in prior art circuit substrate devices, the top surface of circuit substrate 3 and the bottom side of flip chip 4 are covered by a soft protective resin which consists of silicon rubber or the like having a linear expansion of $2.0 \times 10^{-4}/°C$. In contrast, according to the present embodiment, the first protective resin 6 is rigid and consists of a fine polyimide polymer resin and granular silica having its specified average grain size of 12.5 μm, with a ratio by weight of fine polymer resin to granular silica being 1 to 9. As a result, the first protective resin 6 provides its superior adhesiveness to both the circuit substrate 3 and flip chip 4 and its coefficient of linear expansion of approximately $5 \times 10^{-6}/°C$. ranging between those of flip chip 4 and circuit substrate 3. Similarly to the first protective resin 6, the second protective resin 7 consists essentially of a fine polyimide polymer resin and granular silica, except the grain size of granular silica and the mixing ratio. More specifically, the average grain size of granular silica contained in the second protective resin 7 is approximately 31.5 μm, which is larger than that for the first protective resin 6, while the mixing ratio by weight of fine polymer resin to granular silica is 2 to 8. As a result, the coefficient of linear expansion of the second protective resin 7 is approximately $10 \times 10^{-6}/°C$., which is larger than that of the first protective resin 6. Adhesiveness of the second protective resin 7 to circuit substrate 3 and flip chip 4 is substantially equivalent to that of the first protective resin 6. The third protective resin 8 covering semiconductor chip 5 is a polyimide resin without silica unlike the first and second protective resins 6 and 7. In this embodiment, a rigid resin is referred to as exhibiting rigidity at room temperature after heat treatment, and a soft resin is referred to as exhibiting softness at room temperature. Both of the first and second protective resins 6 and 7 are fluid at room temperature before coagulation by heat treatment, as they contain a volatile solvent such as diethylene glycol dimethyl ether having a viscosity of 0.981 cp at 25° C. However, the first protective resin 6 may have a different content of volatile solvent from that of the second protective resin 7, since the first and second protective resins 6 and 7 respectively include 30 wt % and 25 wt % of volatile solvent relative to the total weight prior to the cure by heat treatment.

In manufacture, as shown in FIG. 1, a substrate assembly is prepared by bonding the flip chip 4 on the circuit substrate 3 and the first protective resin 6 is applied to a side of the flip chip 4. Because the poured first protective resin 6 contains a relatively large amount of volatile solvent and the granular silica of a relatively small average grain size of 12.5 μm, it flows smoothly between the flip chip 4 and circuit substrate 3 for full filling.

The obtained assembly is then maintained at room temperature for approximately an hour to remove a part of the volatile solvent contained in the first protective resin 6 by volatilization. This results in loss of fluidity of first protective resin 6. In the next step, the second protective resin 7 is deposited over the entire surface of the circuit substrate 3 to cover the flip chip 4 and first protective resin 6. As the applied second protective resin 7 contains silica of average grain size greater than and an amount of volatile solvent smaller than that of the first protective resin 6, the second protective resin 7 has inferior fluidity. Then, the first and second protective resins 6 and 7 are subjected to successive heat treatment processes of five hours at room temperature, four hours at 40° C., and three hours at 150° C. so as to volatilize substantially all of the volatile solvent contained in the first and second protective resin 6 and 7. Upon completion of volatilization of the solvent, the first protective resin 6 is reduced in volume as compared to its condition prior to heat treatment. However, the resulting first protective resin 6, which contains a larger amount of granular silica than fine polymer resin, is formed into the structure wherein foam is distributed after volatilization of the solvent. In other words the first protective resin 6 forms a porous structure like a "pumice" which comprises granular silica, fine polymer resin for bonding of granular silica, and foam (voids) formed by volatilization of the solvent. Consequently, as the top surface of the first protective resin 6 is bonded to the main surface of the flip chip 4 and thus comes in direct contact therewith, no clearance is formed between the first protective resin 6 and flip chip 4.

Similarly, the second protective resin 7 also becomes porous by volatilization of the solvent, but has a smaller porosity than that of the first protective resin 6 with the smaller content of volatile solvent.

The first protective resin 6 has its coefficient of linear expansion intermediate between those of flip chip 4 and circuit substrate 3 and therefore may effectively mitigate thermal stress in solder bumps 11 which might be induced by differential in the coefficients of thermal expansion between flip chip 4 and circuit substrate 3. Moreover, as the average grain size of granular silica contained in the first protective resin 6 and its mixing ratio may be adjusted at 12.5 $\mu$m and 90 wt %, respectively, the coefficient of linear expansion of the first protective resin 6 can become an optimal value of $5 \times 10^{-6}$/°C. capable of mitigating thermal stress in solder bumps 11. Furthermore, because the first protective resin 6 offers its superior fluidity prior to heat treatment, it can be filled rapidly and sufficiently between the flip chip 4 and circuit substrate 3.

Figure 3:
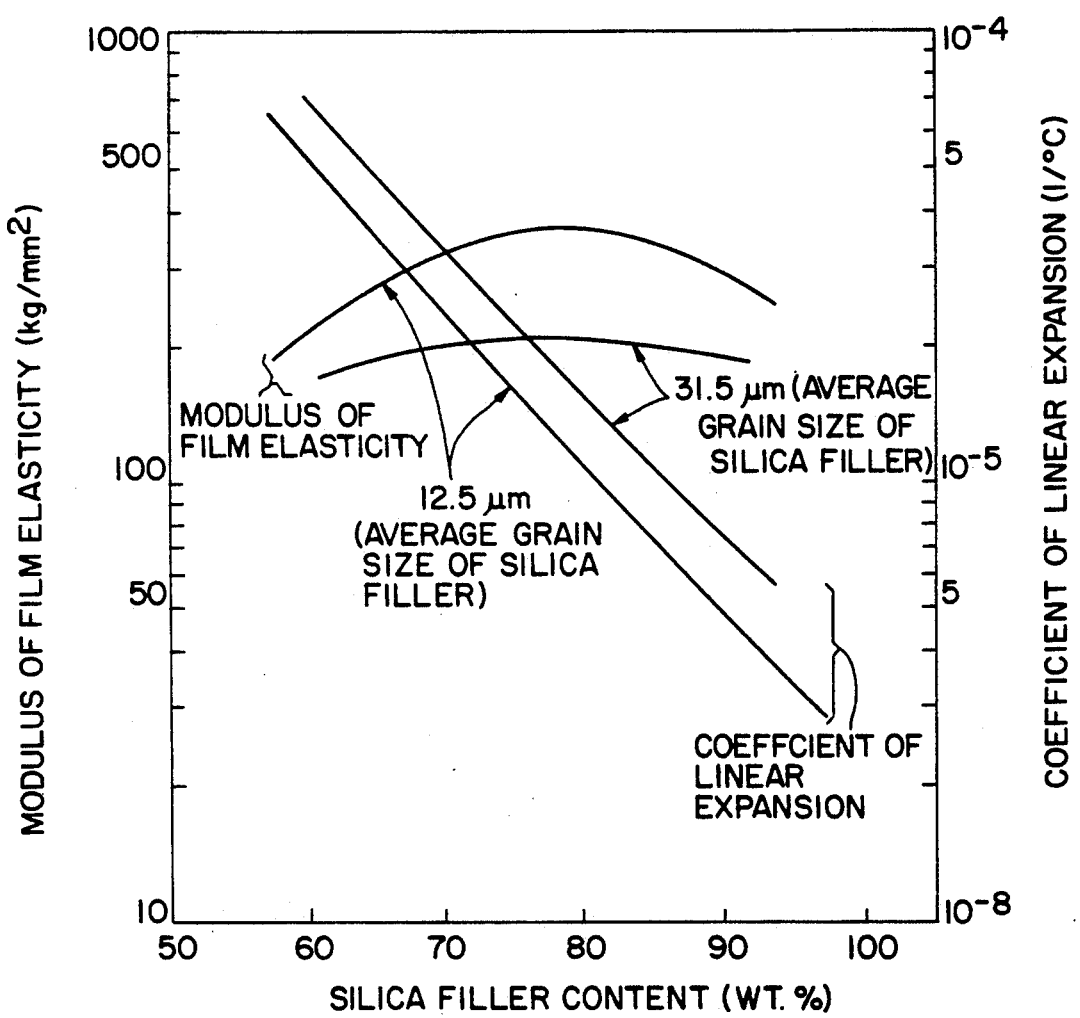
FIG. 3 is a graph illustrating characteristic relationships between the silica filler content, the modulus of film elasticity and the coefficient of linear expansion.

As understood from FIG. 3, the coefficient of linear expansion of the first protective resin 6 increases with decrease of the mixing ratio of granular silica. If the coefficient of linear expansion of the resin exceeds $6.8 \times 10^{-6}$/°C. of circuit substrate 3, it is unsuitable as a filler for mitigating stress. On the other hand, the coefficient of linear expansion decreases with increase of the mixing ratio of granular silica. If the coefficient of linear expansion is lowered below $3.0 \times 10^{-6}$/°C. of flip chip 4, it also is unsuitable as a filler for mitigating stress. Furthermore, even if the mixing ratio of granular silica is kept constant, the coefficient of linear expansion undesirably increases with increase of the grain size and with decrease of the modulus of film elasticity. FIG. 3 also shows coefficients of linear expansion obtained with the same average grain size of 31.5 $\mu$m in the second protective resin 7 for comparison. As shown, even at a 90 wt % mixing ratio of granular silica, the first protective resin 6 has a greater coefficient of linear expansion than that of circuit substrate 3 when the average grain size is 31.5 $\mu$m so that it fails to serve adequately as a filler for mitigating stress. It is also found that the modulus of film elasticity decreases in this mixing ratio, resulting in reduction of effect for mitigating mechanical stress induced by warpage of circuit substrate 3. On the other hand, if the average grain size of granular silica becomes smaller with a smaller coefficient of linear expansion and greater modulus of film elasticity, thixotropy occurs in the first protective resin 6 prior to heat treatment and its viscosity increases. This would make it difficult for the first protective resin 6 to adequately flow between the flip chip 4 and circuit substrate 3.

As described above, it is important that the mixing ratio of granular silica contained in the first protective resin 6 and its average grain size are adjusted to obtain an optimal coefficient of linear expansion and modulus of film elasticity for the filler suitable for mitigating stress and simultaneously to provide a superior fluidity of the resin at the time of formation.

It will be appreciated that modifications may be made to the foregoing embodiment of the present invention as described below.

(1) Although the same mixing ratio of volatile solvent may be selected in the first and second protective resins 6 and 7 prior to heat treatment, it is preferable that the resin for covering the entire surface of circuit substrate 3 or for covering the first protective resin 6 should have a limited distribution of foam or a low porosity. Consequently, the content of volatile solvent contained in second protective resin 7 should preferably be lower by 3 wt % or more than that contained in first protective resin 6.

(2) It is desirable that the first protective resin 6 should have 25 wt % or more, preferably 30 wt % or more of volatile solvent relative to the total weight before heat treatment so that it may easily flow between the flip chip 4 and circuit substrate 3. However, the content of volatile solvent should preferably be 40 wt % or less, more preferably 35 wt % or less to prevent formation of clearance between the flip chip 4 and first protective resin 6 and to limit distribution of foam in the protective resin within a permissible range.

(3) Although the second protective resin 7 may have the same mixing ratio of granular silica as that of the first protective resin 6, it is desirable that the coefficients of linear expansion increase stepwise from the first and second protective resins 6 and 7 to the resin encapsulant 9 to mitigate thermal stress and especially to prevent fractures of lead wire 12 at the interface between the second protective resin 7 and resin encapsulant 9. Thus, the second protective resin 7 should preferably have a lower mixing ratio of granular silica than that of the first protective resin 6 by 2 wt % or more, preferably by 5 wt % or more. If the same mixing ratio is used, the average grain size of silica contained in the second protective resin 7 may be greater than that in the first protective resin 6 by 5 $\mu$m or more, preferably by 10 $\mu$m or more to enhance the coefficient of linear expansion.

(4) It is desirable that the mixing ratio of silica contained in the first protective resin 6 should be from 85.5 to 96.5 wt % in view of the above-mentioned coefficient of linear expansion. Within this range, the coefficient of linear expansion increases with decrease of mixing ratios of silica, while the modulus of film elasticity decreases with increase of the mixing ratio. Thus, a more desirable range may be specified as 87.5 to 92.5 wt % of the mixing ratio.

(5) The average grain size of silica for the first protective resin 6 should be from 5 μm to 25 μm or more, preferably from 7 μm to 20 μm in consideration of its coefficient of linear expansion, modulus of film elasticity and thixotropy.

(6) Polyamide resin may be used as a fine polymer resin in the present invention.

(7) The first protective resin 6 may be formed to cover the entire surface of the circuit substrate 3.

(8) Solder bumps 11 may be provided on the conductive pattern 10 only or on both flip chip 4 and conductive pattern 10.

(9) A connection between solder bump 11 and an electrode of conductive pattern 10 or flip chip 4 may be provided by bonding them with the first protective resin 6.

We claim:

1. A method for manufacturing a circuit substrate device comprising the steps of:

preparing a circuit substrate with a semiconductor element wherein a conductive pattern is formed on a main surface of the substrate and wherein said semiconductor element is electrically connected via electrode lugs to said conductive pattern, main surfaces of said semiconductor element and said circuit substrate being placed in an opposite and spaced relation to each other;

filling an area defined between said circuit substrate and said semiconductor element with a first protective resin which contains granular silica of 85.5 to 96.5 by weight percent, a volatile solvent and a first resin selected from the group consisting of polyimide and polyamide, to produce a smaller coefficient of linear expansion of said first protective resin than that of said circuit substrate and a greater coefficient of linear expansion of said first protective resin than that of said semiconductor element;

applying a second protective resin over said semiconductor element and said first protective resin, said second protective resin containing granular silica, volatile solvent and a second resin selected from the group consisting of polyimide and polyamide, wherein the content of said granular silica in said second protective resin is smaller by 2 weight percent or more than that in said first protective resin to produce a greater coefficient of linear expansion of said second protective resin than that of said first protective resin; and removing the volatile solvent substantially by volatilization from said first and second protective resins.

2. A method according to claim 1 wherein the content of said volatile solvent added to said second protective resin is less than the content of said volatile solvent added to said first protective resin, thereby resulting in a smaller porosity of said second protective resin than that of said first protective resin.

3. A method according to claim 1 wherein mixture ratio by weight of said first resin to said granular silica in said first protective resin is 1 to 9, and mixture ratio by weight of said second resin to said granular silica in said second protective resin is 2 to 8.

4. A method according to claim 1 including the step of applying a resin encapsulant covering said second protective resin, wherein the second protective resin has a smaller coefficient of linear expansion than that of said resin encapsulant.

5. A method according to claim 1 including the step of providing that the average grain size of granular silica in the first protective resin is from 5 to 25 microns and that the average grain size of granular silica in the second protective resin is larger by 5 microns or more than that contained in the first protective resin.

6. A method for manufacturing a circuit substrate device comprising the steps of:

preparing a circuit substrate with a semiconductor element wherein a conductive pattern is formed on a main surface of the substrate and wherein said semiconductor element is electrically connected via electrode lugs to said conductive pattern, main surfaces of said semiconductor element and said circuit substrate being placed in an opposite and spaced relation to each other;

filling an area defined between said circuit substrate and said semiconductor element with a first protective resin which contains granular silica of 85.5 to 96.5 weight percent, a volatile solvent and a first resin selected from the group consisting of polyimide and polyamide, to produce a smaller coefficient of linear expansion of said first protective resin than that of said circuit substrate and a greater coefficient of linear expansion of said first protective resin than that of said semiconductor element;

removing at least a part of volatile solvent contained in said first protective resin by volatilization;

applying a second protective resin over said semiconductor element and said first protective resin, said second protective resin containing granular silica, volatile solvent and a second resin selected from the group consisting of polyimide and polyamide, wherein the content of said granular silica in said second protective resin is smaller by 2 weight percent or more than that in said first protective resin to produce greater coefficient of linear expansion of said second protective resin than that of said first protective resin; and removing a substantial majority of the remaining volatile solvent by volatilization from said first and second protective resins.

7. A method according to claim 6 wherein the content of said volatile solvent in said second protective resin is smaller than the content of said volatile solvent in said first protective resin, thereby resulting in smaller porosity of said second protective resin than that of said first protective resin.

8. A method according to claim 6 wherein mixture ratio by weight of said first resin to said granular silica in said first protective resin is 1 to 9, and mixture ratio by weight of said second resin to said granular silica in said second protective resin is 2 to 8.

9. A method according to claim 6 including the step of providing that the average grain size of granular silica in the first protective resin is from 5 to 25 microns and that the average grain size of granular silica in the second protective resin is larger by 5 microns or more than that contained in the first protective resin.

* * * * *